United States Patent [19]
Lenz

[11] Patent Number: 6,031,279
[45] Date of Patent: Feb. 29, 2000

[54] POWER SEMICONDUCTOR COMPONENT

[75] Inventor: Michael Lenz, Zorneding, Germany

[73] Assignee: Siemens Aktiengesellschaft, Munich, Germany

[21] Appl. No.: 08/921,820

[22] Filed: Sep. 2, 1997

[30] Foreign Application Priority Data

Sep. 2, 1996 [DE] Germany .................. 196 35 582

[51] Int. Cl.⁷ .................. H01L 23/02; H01L 23/48; H01L 23/52; H01L 23/34
[52] U.S. Cl. .................. 257/686; 257/777; 257/728; 257/724; 257/712; 257/713
[58] Field of Search .................. 257/777, 728, 257/712, 713, 723, 684, 686, 700, 724, 782; 361/702, 704, 705, 712, 713, 714

[56] References Cited

U.S. PATENT DOCUMENTS

| | | |
|---|---|---|
| 4,947,234 | 8/1990 | Einzinger et al. . |
| 5,502,289 | 3/1996 | Takiar et al. . |
| 5,532,512 | 7/1996 | Fillion et al. .................. 361/705 |

FOREIGN PATENT DOCUMENTS

| | | |
|---|---|---|
| 91114960 | 11/1992 | European Pat. Off. . |
| 357031166 | 2/1982 | Japan .................. 257/777 |
| 405275611 | 10/1993 | Japan .................. 257/723 |

OTHER PUBLICATIONS

Japanese Patent Abstract No. 04075368 (Naritaka), dated Mar. 10, 1992.

Primary Examiner—Mahshid Saadat
Assistant Examiner—Jesse A. Fenty
Attorney, Agent, or Firm—Herbert L. Lerner; Laurence A. Greenberg

[57] ABSTRACT

A power semiconductor component includes a first chip having a vertical first transistor. A second chip with a second vertical transistor is mounted on the first chip in such a way that load paths of the two transistors are connected in series. The configuration can easily be expanded into a full bridge.

5 Claims, 1 Drawing Sheet

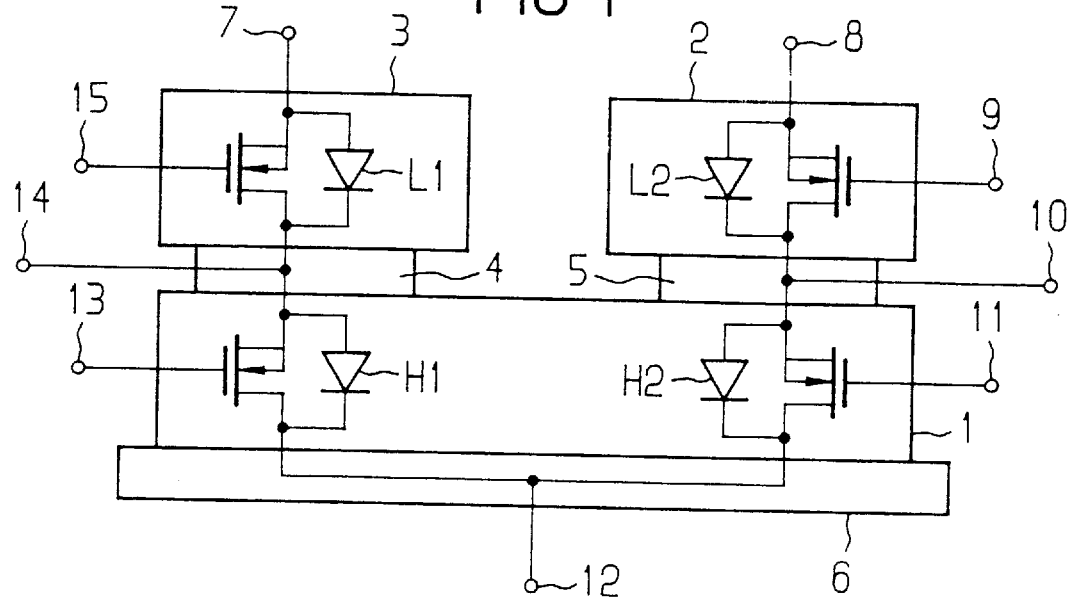
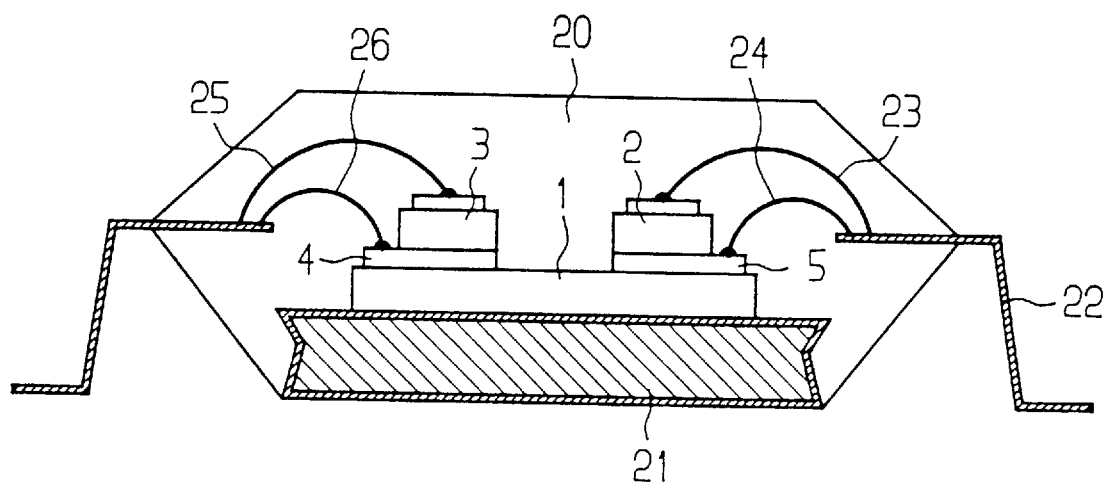

POWER SEMICONDUCTOR COMPONENT

BACKGROUND OF THE INVENTION

FIELD OF THE INVENTION

The invention relates to a power semiconductor component.

Such components are needed particularly in the development of inexpensive, reliable configurations for driving DC motors constructed for currents of 10 to approximately 50 A. The employment of such components is useful primary in the automotive field, for instance in window raisers, seat adjusters, windshield washers, sliding roofs, and so forth. In order to provide for the DC motors to be triggered, a so-called H bridge configuration is needed. That is a full bridge with four switches, two each connected in series between a feed voltage and ground. The DC motor is connected between connecting points of the switches. Therefore, the feed voltage can be connected bidirectionally to the motor. A single branch of the configuration is also referred to as a half-bridge. The residual resistance of the switches causes power loss and thus impairs the efficiency of the system.

In the case of relatively low motor currents, the bridge configuration can be integrated monolithically. So-called hybrid technologies which are preferably used for that purpose make it possible for analog and digital supplementary functions to be integrated monolithically along with D-MOS power switching transistors. Due to the relatively high on-state resistance $R_{DSON}$, the load current, at acceptable power losses for those structures, remains below about 10 A. The reason for the relatively high on-state resistances can be found in the lateral current flow and in the fact that there are two relatively high impedance bonded connections. One such component is described in a catalog of the firm Siliconix, entitled: Power Products Data Book 1994, p. 1–93.

Electromechanical relays are therefore used more and more today at higher current values. However, those components have disadvantages, such as poor reliability and a limited service life. They are hard to process, and they are neither resistant to vibration nor low in noise. All of those disadvantages can be avoided with currently available so-called vertical technologies, in which only a single bonded connection is needed. In that technology, a semiconductor chip is mounted on a cooling surface that acts at the same time as a drain terminal and therefore saves one high-impedance bonded connection. With such a technology, the turn-on resistances are therefore at extremely low values.

If one wishes to construct a bridge drive with those components, then a plurality of cooling surfaces are needed, which have to be galvanically separated. A bridge or even a half bridge can certainly not be integrated monolithically. Only the two high-side switches can be made on a chip, since the rear sides of the chip are the respective drain terminals. Thus for an aforementioned H bridge configuration, three chips are needed, which are mounted on three separate cooling surfaces. They are accommodated in a package with relatively high heat resistance, for instance. The bridge circuit can therefore be used only for high pulsating currents or low continuous currents. Packages with low heat resistances are very expensive and therefore do not prevail. Mounting on ceramic or other substrates is conceivable but at present is also too expensive. The least expensive version is to interconnect discrete elements, that is one double high-side switch and two low-side switches.

SUMMARY OF THE INVENTION

It is accordingly an object of the invention to provide a power semiconductor component, which overcomes the hereinafore-mentioned disadvantages of the heretofore-known devices of this general type and with which both an integrated half bridge and an integrated full bridge can be realized.

With the foregoing and other objects in view there is provided, in accordance with the invention, a power semiconductor component, comprising a cooling surface; a first chip mounted on the cooling surface and having a vertical first transistor with a load path; a second chip mounted on the first chip and having a vertical second transistor with a load path; and the load paths of the first and second transistors connected in series.

In accordance with another feature of the invention, there is provided at least one third chip mounted on the first chip and having a vertical fourth transistor with a load path; the first chip having at least one third transistor with a source side insulated from the first transistor and with a load path; and the load paths of the third and fourth transistors connected in series.

In accordance with a further feature of the invention, the second or third chip has a given effective drain terminal area, and the first transistor on the first chip has an effective source terminal area larger than the given effective drain terminal area.

In accordance with an added feature of the invention, the first chip has a trigger circuit for the power transistors.

In accordance with a concomitant feature of the invention, the first chip has at least one guard circuit for the power transistors.

An advantage of the configuration is that a half bridge is realized by the chip-on-chip mounting according to the invention in such a way that the load paths of two power transistors are connected in series as a result of the mounting. Such a configuration can easily be expanded into an integrated full bridge.

Due to the chip-on-chip mounting, the temperature of the mounted chips can be detected through the use of the chip located beneath. The mounted semiconductor switches acting as low-side switches can therefore be constructed without their own intelligence, thus reducing the production costs for the component.

Other features which are considered as characteristic for the invention are set forth in the appended claims.

Although the invention is illustrated and described herein as embodied in a power semiconductor component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a basic schematic circuit diagram of a full bridge according to the invention with a substitute circuit diagram; and FIG. 2 is a sectional view of a semiconductor component according to the invention.

DESCRIPTION OF THE PREFERRED EMBODIMENTS

Referring now to the figures of the drawings in detail and first, particularly, to FIG. 1 thereof, there is seen a schematic illustration of a semiconductor component of the invention. Reference numeral 6 designates a cooling surface, on which a first chip 1 is mounted. This chip 1 includes two semiconductor switches H1, H2, that are insulated from one another on their source side. Two drain terminals of the semiconductor switches H1 and H2 form a rear side of the chip.

The chip is mounted with its back on the cooling surface 6 and can be contacted through a terminal 12. Second and third chips 2 and 3 are then mounted by soldering, sintering or other mounting processes on the source surfaces of the two transistors H1 and H2, and each of these chips contains one respective further power transistor L1 and L2. As a result of this mounting, the drain region of the transistor L1 is connected to the source region of the transistor H1, and the drain region of the transistor L2 is connected to the source region of the transistor H2. A node point of each of these respective connections 4, 5 can be connected externally through respective terminals 10 and 14. Respective source regions of the transistors L1 and L2 can also be contacted, for instance by bonding, through external terminals 7 and 8. Terminals 9, 11, 13 and 15 for triggering the respective transistors L2, H2, H1, L1 of the full bridge are connectable in a known manner.

FIG. 2 shows one possible embodiment of such a configuration according to the invention in a package. A surface-mountable package 20, for instance, with respective external terminals 22 is shown. A receptacle device 21 which is provided inside the package at the same time can serve as a cooling body and therefore as a contact region for the drain terminal and as a substrate for the entire configuration. The first semiconductor chip 1 is secured in a known manner, by soldering, sintering or the like on this receptacle or mounting device 21. The two source surfaces of the transistors H1 and H2 are located on the surface of the chip 1 and are larger than the effective drain terminal area of the second and third chips 2, 3 mounted on them. As a result, the respective contacting surface 4 and 5 can be placed in contact from above in a simple way with the externally accessible terminals 22 through the use of bond wires 24 and 26. The source surfaces of the semiconductor chips 2 and 3 are likewise connected from above through bond wires 23 and 25 to the respective externally accessible terminals or pins 22.

In the case of this kind of configuration, it is a condition that the chips 2 and 3 which contain the low-side transistors are smaller in their drain terminal outline than the respective source contacting surfaces of the high-side switches H1 and H2 in the first chip. Moreover, the respective connections 4, 5 between the chips 1 and 2 as well as between the chips 1 and 3 must be thick enough to be able to carry current laterally. The reason for this is that the current either flows through the respective line 26 or 24 to the drain of the transistors L1 or L2 under the respective chip 2 or 3, or flows at least partly from the source of the transistors H1 or H2 under the respective chip 2 or 3 laterally to the wires 24 or 26.

During operation as motor drivers, the switching transistors L1, L2, H1, H2 are each under load crosswise. This fact provides the advantage of ensuring that the two transistors L1 and H1, or L2 and H2, which are located one above the other, are never loaded at the same time. Moreover, the high-side switch H1 or H2 located on the bottom can sense the temperature of the low-side transistor L1 or L2 above it. The low-side transistor L1 or L2 can therefore be constructed without its own intelligence, or in other words, for instance, without a guard circuit to protect against excess temperature or excess load and so forth. In this way, the low-side switch can be produced by an inexpensive process that is optimized for minimal turn-on resistance. The condition, for an especially simple bonded connection that can be made from above, as in FIG. 2, which is that the outline of the chips 2 and 3 be smaller than that of the respective source contacting surface of the transistors in the chip 1, can then easily be met, since the high-side switches in the chip 1 are produced by a more-complicated process, because at least groundoriented logic inputs and therefore a charge pump and a corresponding level converter are needed. Moreover, the transistors H1 and H2 in the chip 1 can be provided with guard circuits to protect against excess temperature and excess load, etc.

The configuration according to the invention can be used both for full bridges as in FIGS. 1 and 2 and for half bridges, in which the transistors H2 and L2, for instance, are omitted. In particular, it is useful to make a half bridge, if the power loss of a complete H bridge circuit is not feasible in an inexpensive package, since the dimensions of inexpensive packages are exceeded or the temperature conditions cannot be met by the package.

I claim:

1. A power semiconductor component, comprising:

a cooling surface;

a first chip mounted on said cooling surface and having a vertical first transistor with a load path and least one second transistor with a source side insulated from said first transistor and with a load path;

a second chip mounted on said first chip and having a vertical third transistor with a load path, said load paths of said first and third transistors connected in series; and at least one third chip mounted on said first chip and having a vertical fourth transistor with a load path, said load paths of said second and fourth transistors connected in series.

2. The power semiconductor component according to claim 1, wherein said second chip has a given effective drain terminal area, and said first transistor on said first chip has an effective source terminal area larger than said given effective drain terminal area of said second chip.

3. The power semiconductor component according to claim 1, wherein said second and third chips have a given effective drain terminal area, and said first and second transistors on said first chip have an effective source terminal area larger than said given effective drain terminal area of said second and third chips.

4. The power semiconductor component according to claim 1, wherein said first chip has a trigger circuit for said first and second transistors.

5. The power semiconductor component according to claim 1, wherein said first chip has at least one guard circuit for said first and second transistors.

* * * * *